(12) United States Patent
Miyano

(10) Patent No.: US 6,417,551 B2
(45) Date of Patent: Jul. 9, 2002

(54) SEMICONDUCTOR DEVICE AND METHOD OF MANUFACTURING THE SAME

(75) Inventor: Kiyotaka Miyano, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/788,355

(22) Filed: Feb. 21, 2001

Related U.S. Application Data

(62) Division of application No. 09/113,632, filed on Jul. 10, 1998, now Pat. No. 6,228,752.

(30) Foreign Application Priority Data

Jul. 11, 1997 (JP) .............................................. 9-186835

(51) Int. Cl.[7] ............................................ H01L 21/336
(52) U.S. Cl. ..................... 257/412; 438/585; 438/300; 257/413
(58) Field of Search ................................ 257/314, 388, 257/412, 413; 438/585, 592, 300, 304

(56) References Cited

U.S. PATENT DOCUMENTS

| | | |
|---|---|---|
| 4,505,028 A | 3/1985 | Kobayashi et al. |
| 5,937,300 A * | 8/1999 | Sekine et al. ............... 438/300 |
| 6,017,809 A * | 1/2000 | Inumiya et al. ............. 438/585 |
| 6,180,474 B1 * | 1/2001 | Kim ........................... 438/304 |

FOREIGN PATENT DOCUMENTS

JP 60009166 A 1/1985

OTHER PUBLICATIONS

Kiyotaka Miyano et al., "Suppression of W Vaporization during Si Selective Oxidation by Controlling $H_2O/H_2$ Pressure Ratio", Conference Proceedings ULSI XIII (1998) ©Materials Research Society, pp. 677–683.

* cited by examiner

Primary Examiner—David Nelms
Assistant Examiner—Thao P Le
(74) Attorney, Agent, or Firm—Finnegan, Henderson, Farabow, Garrett & Dunner, L.L.P.

(57) ABSTRACT

The present invention provides a method of manufacturing a semiconductor device, comprising the steps of forming a gate insulating film, on a semiconductor substrate, forming a gate electrode containing a refractory metal layer on the gate insulation film, and heat-processing the semiconductor substrate in an atmosphere containing water vapor and hydrogen, to lessen a damage caused to a portion of the semiconductor substrate, which is located close to an end portion of the gate electrode. The heat-processing step is carried out while controlling a vapor pressure of a refractory metal oxo-acid generated on a surface of the high-melting metal layer.

4 Claims, 9 Drawing Sheets

SEMICONDUCTOR DEVICE AND METHOD OF MANUFACTURING THE SAME

This is a division of application Ser. No. 09/113,632, filed Jul. 10, 1998, now U.S. Pat. No. 6,228,752, which is incorporated herein by reference.

BACKGROUND OF THE INVENTION

The present invention relates to a semiconductor device having a wiring layer made of a metal or a metal laminate, and a method of manufacturing such a semiconductor device, and more specifically, to a semiconductor having a wiring layer containing a refractory metal, and a method of manufacturing such a device.

In the method of manufacturing an MOS (metal oxide semiconductor) type integrated circuit, some damages are caused to an end portion of a gate due to RIE (reactive ion etching), ion injection, stress or the like. In order to lessen such damages, it is conventionally considered that an oxidization step should be provided. A gate electrode containing polycrystalline silicon can be oxidized as the electrode is heated in an atmosphere containing dry oxygen or water vapor.

In the meantime, in order to realize a semiconductor device having a fine size and operating at high speed, the development of a metal gate electrode made of a single layer having a low resistance (to be called "metal gate electrode") or a gate electrode having a laminate structure of metal and polycrystalline silicon (to be called polymetal gate electrode) and the like, is presently being progressed.

However, in the oxidizing atmosphere described above, the metal is more easily oxidized than silicon due to the difference between them in the formation energy of an oxide. Thus, the oxidizing rate for metal is very high, and therefore a gate electrode containing metal changes its shape such as the peeling off of the film, due to volume expansion.

In order to avoid this problem, a technique has been proposed (Jnp. Pat. Appln. KOKAI Publication No. 60-9166), for selectively oxidizing silicon only without oxidizing metal by heating an electrode in a mixture gas of water vapor serving as oxidizing agent, and hydrogen serving as reducing agent.

However, according to the researches made by the inventors of the present invention, it has been found that when a metal gate electrode made of a refractory metal such as W or Mo, or a polymetal gate electrode containing a refractory metal such as W or Mo, is subjected to a heat process carried out in an atmosphere containing hydrogen and water vapor, the width of a metal electrode portion is reduced, or the layer is thinned. In the case of a polymetal gate electrode, the cross section of the electrode is decreased, and therefore the resistance value is increased. In the case of a metal gate electrode, not only the resistance value is increased, but also the effective gate length is decreased, and therefore the electrical characteristics of the product would not have appropriate values as designed.

Further, it has been found that if a heat process is carried out at a temperature of 800 to 900° C., not only the decrease in the width or thinning of the electrode occurs, but also whiskers are created on the surface of a metal wiring. The whiskers, in some cases, have a length of several hundred nano-meters. As a result, an interlayer insulation film or the like cannot be deposited uniformly, and such non-uniformed deposition may become a cause for short-circuiting or leakage of current.

BRIEF SUMMARY OF THE INVENTION

An object of the present invention is to provide a method of manufacturing a highly reliable semiconductor device, by suppressing the change in the shape of the refractory metal layer.

Another object of the invention is to provide a highly reliable semiconductor device by suppressing the change in the shape of the refractory metal layer which constitutes the gate electrode.

According to the present invention, there is provided a method of manufacturing a semiconductor device, comprising the steps of: forming a conductive layer including a refractory metal layer, on a semiconductor substrate; and heat-processing the semiconductor substrate having the conductive layer, in an atmosphere containing water vapor and hydrogen, wherein the heat-processing step is carried out while controlling the vapor pressure of oxo-acid of refractory metal generated on the surface of the refractory metal layer.

Further, according to the present invention, there is provided a method of manufacturing a semiconductor device, comprising the steps of: forming a gate insulation film on a semiconductor substrate; forming a gate electrode containing a refractory layer, on the gate insulation film; heat-processing the semiconductor substrate in an atmosphere containing water vapor and hydrogen to lessen a damage caused to a portion of the semiconductor substrate, which is close to an end portion of the gate electrode, wherein the heat-processing step is carried out while controlling the vapor pressure of oxo-acid of refractory metal generated on the surface of the refractory metal layer.

Furthermore, according to the present invention, there is provided a semiconductor device comprising: a semiconductor substrate; a gate insulation film formed on the semiconductor substrate; and a gate electrode made of a laminate layer including a silicon layer formed on the gate insulation film, and a refractory metal layer, wherein the end portion of the refractory metal layer projects sidewards from the end portion of the silicon layer, and a silicon oxide film is formed on a side surface of the silicon layer located underneath the end portion of the refractory layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
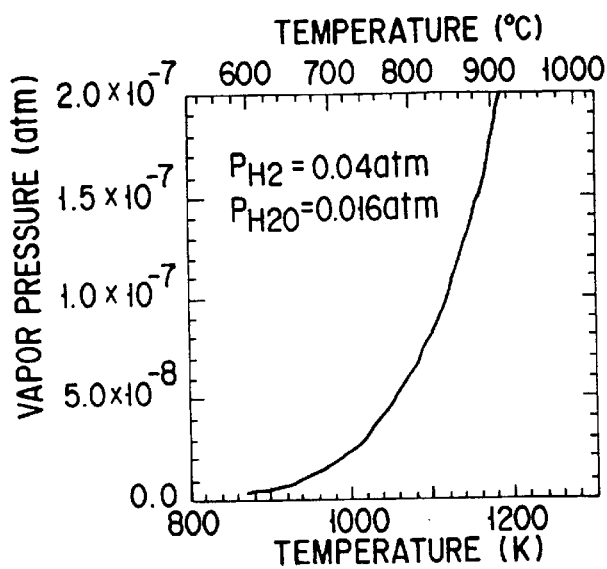
FIG. 1 is a graph illustrating the temperature-dependency of the vapor pressure of oxo-acid of W, in the first example.

The present invention is based on the findings described below, obtained in intensive studies made by the inventor(s) of the present invention, regarding the phenomenon that when a refractory metal layer is heat-processed in an atmosphere containing water vapor and hydrogen, the narrowing and thinning of the layer occur, and further whiskers are generated on the surface of the refractory metal layer.

That is, a refractory metal is heat-processed in an atmosphere containing water vapor and hydrogen, an oxo-acid of the refractory metal is formed. The oxo-acid has a vapor pressure higher than that of an oxide of the refractory metal. In an extreme case, the refractory metal layer is narrowed and thinned so that the electrical resistance is increased, or the oxo-acid is re-crystallized to generate whiskers on the surface of the refractory metal layer, thereby causing the deformation of the gate electrode.

It should be noted that under the conditions, 800° C. and $P_{H2O}/P_{H2}=0.75$, the vapor pressure of $WO_2$, which is an oxide of W, is $8.3 \times 10^{-18}$ atm, and the vapor pressure of $WO_3$ is $4.0 \times 10^{-17}$ atm, whereas the vapor pressure of oxo-acid of W is $4.5 \times 10^{-7}$ atm.

In consideration of the above facts, it was found that, in order to prevent the narrowing and thinning of the refractory metal layer and the formation of whiskers on the surface of the refractory layer, the amount of oxo-acid generated should be reduced, in other words, the vapor pressure of oxo-acid should be controlled.

As described above, the narrowing and thinning of the layer of the metal wiring can be avoided by controlling the vapor pressure of the oxo-acid, and therefore an increase in wiring resistance and degrading of shape can be prevented. Therefore, it becomes possible to manufacture a high performance semiconductor device.

It should be noted that the change in the shape of a refractory metal layer, indicated here is specified as a change caused by the narrowing and thinning of the layer, which occur as the refractory metal evaporates (that is, the generation of oxo-acid), and by the growth of whiskers on the surface of the refractory metal surface, which is induced by the re-crystallization of the substances which were once gasified.

Preferable aspects of the present invention will now be listed.

(1) The vapor pressure of oxo-acid of the refractory metal is controlled by controlling at least one parameter selected from the group consisting of controlling the ratio between a partial pressure of water vapor and a partial pressure of hydrogen, contained in an atmosphere, substrate temperature and gas flow.

(2) The heat process is carried out while sealing a gas containing water vapor and hydrogen in a reaction chamber.

(3) Prior to the heat processing step, an additional step of removing the oxide layer formed on the surface of the refractory metal layer, is provided.

(4) The vapor pressure of the oxo-acid of the refractory metal is controlled to be $1 \times 10^{-6}$ atom or less.

(5) The ratio between the partial pressure of water vapor and the partial pressure of hydrogen, contained in the atmosphere at a temperature of 800° C. is controlled to be 0.17 or less.

(6) During the heat process, the temperature of the substrate is controlled to be in a range between 700° C. and 950° C.

(7) The refractory metal is one selected from the group consisting of tungsten, molybdenum and titanium.

(8) The conductive layer is made of the refractory metal layer only.

(9) The conductive layer is made of a laminate member including a polycrystalline silicon layer and a refractory metal layer.

(10) A reaction preventing layer is provided between the polycrystalline silicon layer and the refractory metal layer.

With the above-described structural items, the present invention exhibits the following operational effects.

The researches made by the inventors have revealed the fact that the narrowing and thinning of the refractory metal layer, which occur in the heat process carried out on the refractory metal, in a mixture atmosphere of hydrogen, water vapor and some other diluting gas, occur as the metal oxo-acid of metal M having a high vapor pressure (that is, $MH_xO_y$) is generated. In the case where the vapor pressure of the oxo-acid generated is high, the amount of metal gasified is increased, and therefore the narrowing and thinning of the metal wiring are caused more prominently.

Further, it has been found that whiskers formed on the surface of the metal layer are formed by the re-crystallization of the evaporated metal oxo-acid.

Therefore, in order to control the change in the shape of the metal wiring or electrode, made of the refractory metal, it suffices if the amount of metal gasified is reduced, that is, the vapor pressure of metal oxo-acid is decreased. More specifically, the partial pressure of water vapor, the partial pressure of hydrogen, the temperature and the gas flow should be adjusted so as to sufficiently reduce the vapor pressure of the metal oxo-acid.

Moreover, the researches conducted by the inventors of the present invention has revealed that in the case where the partial pressure of water vapor, the partial pressure of hydrogen, and the temperature are fixed, the amount of metal gasified increases as the total flow of the processing gas increases. Therefore, in order to control the evaporation of metal, it is preferable that the flow of gas should be reduced during the heat process.

Further, it has been found that in the case where the heat process is carried out when an oxide layer is formed on the surface of the metal wiring, the metal oxo-acid is more easily generated. In order avoid this, it is preferable that the oxide layer on the surface of the metal wiring should be removed prior to the heat process.

In the case where the size of the device is further reduced, the electrode shape-dependency of the device property becomes more prominent, and therefore the technique for suppressing the gasification of a refractory metal, such as of the present invention becomes more important.

In connection with the present invention, it should be noted that in the case where the gate electrode is made of a laminate member consisting of a silicon layer and a refractory metal layer, the silicon layer is oxidized and the size of the layer is decreased by the heat process in the atmosphere containing water vapor and hydrogen. However, the refractory metal layer is not oxidized or the oxo-acid is not generated, and therefore the size of the metal layer does no change. Consequently, the end portion of the refractory metal layer projects sidewards from the end portion of the silicon layer, and a gate oxide film having a structure in which a silicon oxide film is obtained on the side surface of the silicon layer located underneath the end portion of the refractory metal layer.

The measurement of the end portion of the refractory metal layer, which projects sidewards from the end portion of the silicon layer, is usually 1 to 10 nm.

Several examples of the present invention will now be described with reference to accompanying drawings.

EXAMPLE 1

Figure 2:
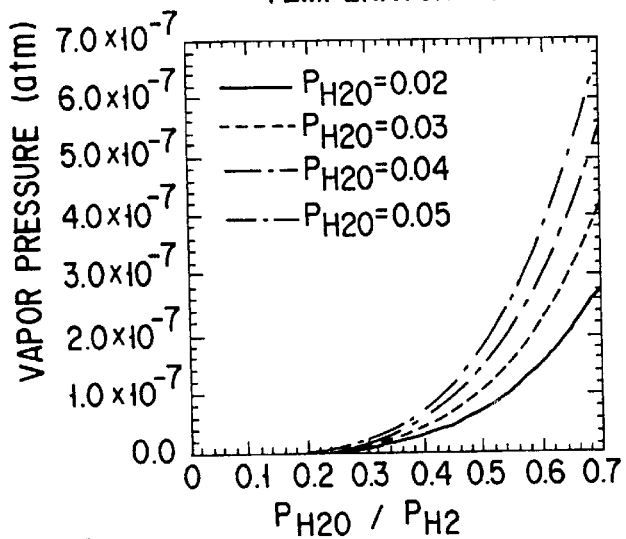
FIG. 2 is a graph illustrating the water vapor partial pressure/hydrogen partial pressure-dependency of the vapor pressure of oxo-acid of W, in the first example.

FIGS. 1 and 2 illustrates, respectively, the temperature-dependency and partial pressure-dependency of the vapor pressure of W oxo-acid generated by the oxidization which is carried out for lessen the damage, in the case where tungsten (W) is used as the material for the gate electrode.

More specifically, FIG. 1 is a graph illustrating the temperature-dependency of the vapor pressure of W oxo-acid in the case where the partial pressure of water vapor, $P_{H2O}$ and the partial pressure of hydrogen, $P_{H2}$, are fixed ($P_{H2O}$=0.08 atm, $P_{H2}$=0.04 atm). As can be understood from FIG. 1, the vapor pressure of W oxo-acid is increased in an exponential function manner as the temperature increases.

Further, FIG. 2 is a graph illustrating the dependency of the vapor pressure of W oxo-acid in terms of the ratio between the partial pressures ($P_{H2O}/P_{H2}$) in the case where the temperature T is fixed. As can be understood from FIG. 2, as the partial pressure ratio becomes higher, the vapor pressure of W oxo-acid is higher. Also, as the water vapor partial pressure, $P_{H2O}$ becomes higher, the vapor pressure of W oxo-acid is higher.

According to the analysis of the inventors of the present invention, in order to make the vapor pressure of W oxo-acid, $WO_3H_2O$, $1\times10^{-5}$ atom or less, it is required that the heat process is carried out under the conditions of a temperature of 800° C. and $(P_{H2O})^4/(P_{H2})^3<0.17$. Under these conditions, the gasification of metal (the generation of metal oxo-acid) can be suppressed.

Figure 3:
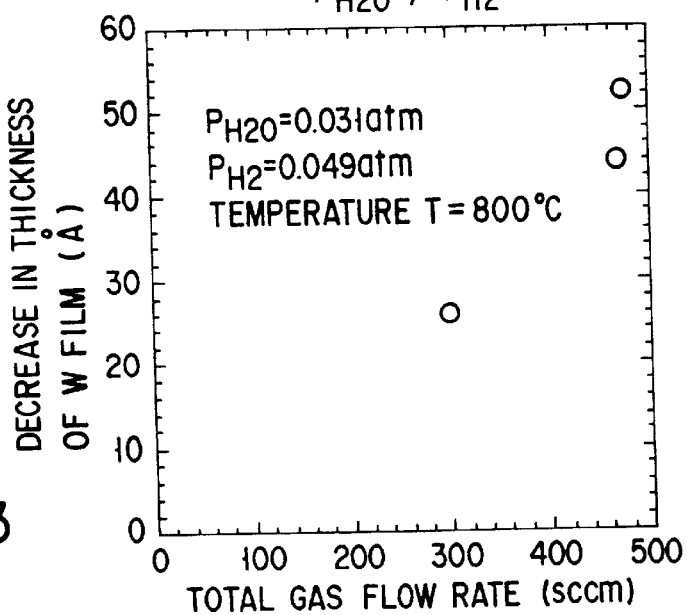
FIG. 3 is a graph illustrating the gas total flow-dependency of the vapor pressure of oxo-acid of W, in the first example.

FIG. 3 is a graph illustrating the dependency of the W gasification amount in terms of the total gas flow. As can be understood from FIG. 3, in the case where the water vapor partial pressure, $P_{H2O}$, the hydrogen partial pressure, $P_{H2}$ and the temperature T are fixed at constant values, the gasification amount of the metal (corresponding to the amount of decrease in the thickness of W) increases as the total flow amount of the process gas increases. In consideration of this fact, in order to suppress the evaporation of the metal (that is, the generation of metal oxo-acid), it is effective to reduce the flow of the processing gas during the heat process.

As described above, when the water vapor partial pressure, $P_{H2O}$, the hydrogen partial pressure, $P_{H2}$ and the temperature T are adjusted and the total flow of the processing gas are reduced, such that the vapor pressure of W oxo-acid becomes sufficiently low, the gasification of W can be effectively controlled. The narrowing and thinning of the electrode, caused by the heat process can be controlled. In this manner, an electrode (wiring) having a predetermined shape and resistance can be obtained.

EXAMPLE 2

FIGS. 4A to 4K are cross sectional views showing the steps of the manufacture of a complimentary MOSFET (CMOSFET) according to the second example of the present invention.

Figure 4A:
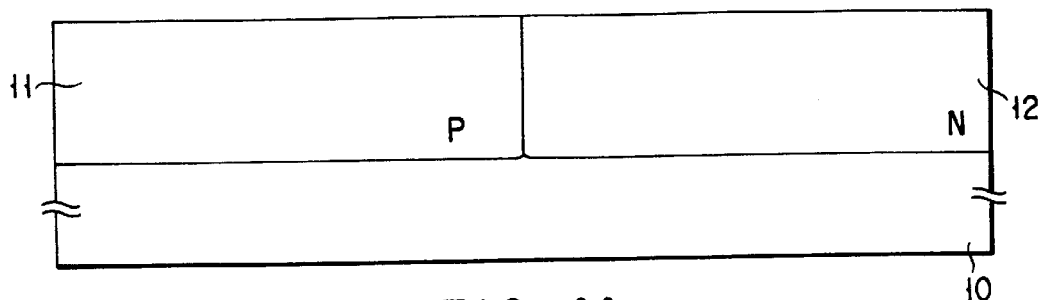
FIGS. 4A to 4K are cross sectional views illustrating steps of the method of manufacturing a semiconductor device, according to the second example.

First, a resist pattern (not shown) which covers a predetermined region of a silicon substrate 10 is formed by a photolithography technique. With use of the resist pattern as a mask, B, Ga or In is ion-implanted to the silicon substrate 10. Then, after the resist pattern is removed, another resist pattern (not shown) which covers the surface of that portion of the silicon substrate 10, to which the ions were injected in the above-described step, is formed. With use of the resist pattern as a mask, As, P or Sb is ion-implanted to the silicon substrate 10. Subsequently, a heat diffusion is carried out, and thereby a P-type region 11 and an N-type region 12, each having a depth of about 1 nm, are formed in the surface portion of the silicon substrate 10 as shown in FIG. 4A.

Figure 4B:
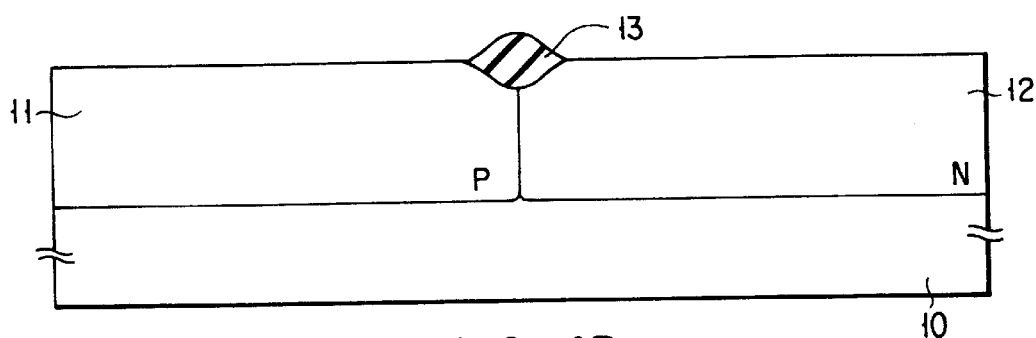

Next, as can be seen in FIG. 4B, an element isolation region 13 made of a silicon oxide film having a thickness of about 600 nm is formed at an interface section between the P-type region 11 and the N-type region 12 of the silicon substrate 10, with use of, for example, LOCOS method.

Figure 4C:
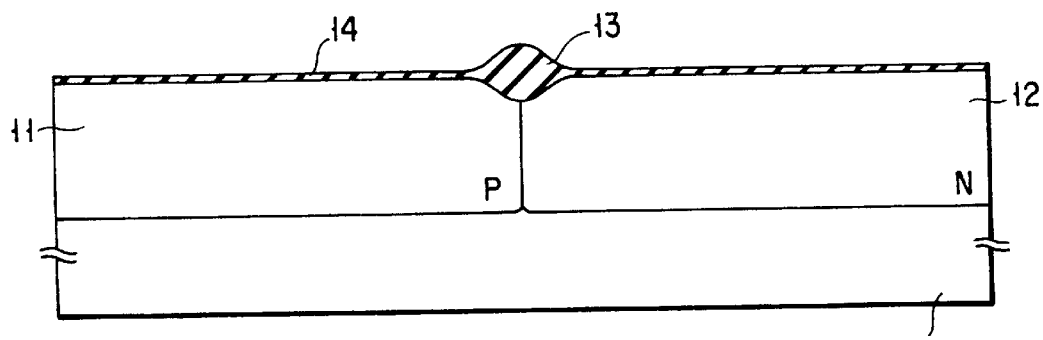

Next, a protection oxide film (not shown) having a thickness of about 10 nm is formed on the surfaces of the P-type region 11 and the N-type region 12. Then, another ion-implantation is carried out to match the threshold value of the transistor, which will be formed later. After that, the protection oxide film is removed, and as can be seen in FIG. 4C, a gate oxide film 14 having a thickness of about several tens of nanometers is formed on the surfaces of the P-type region 11 and the N-type region 12. It should be noted that in the cross sectional views of the steps from this onwards, the illustration of the substrate 10 is omitted.

Figure 4D:
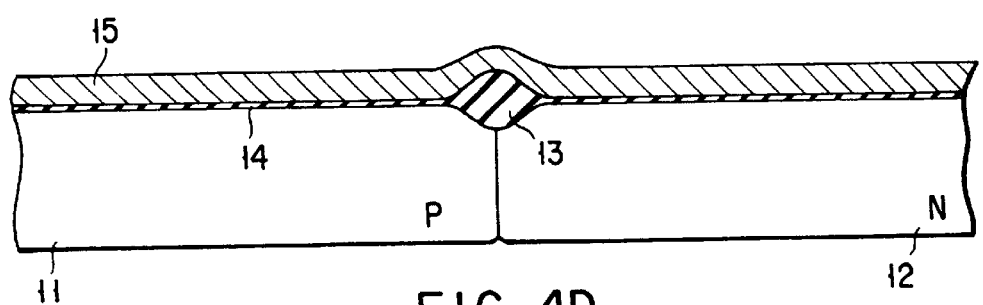

Next, as can be seen in FIG. 4D, a polycrystalline silicon film 15 having a thickness of about 100 nm is deposited on the entire surface. Then, a resist pattern (not shown) for covering a predetermined region is formed by using the photolithography technique. With use of this resist pattern as a mask, B, Ga or In is ion-implanted to the polycrystalline silicon film 15. Similarly, in this case, with use of the resist pattern (not shown) as a mask, for covering the ion-implanted section, As, P or Sb is ion-implanted to that portion of the polycrystalline silicon film 15 which were not ion-implanted.

Figure 4E:
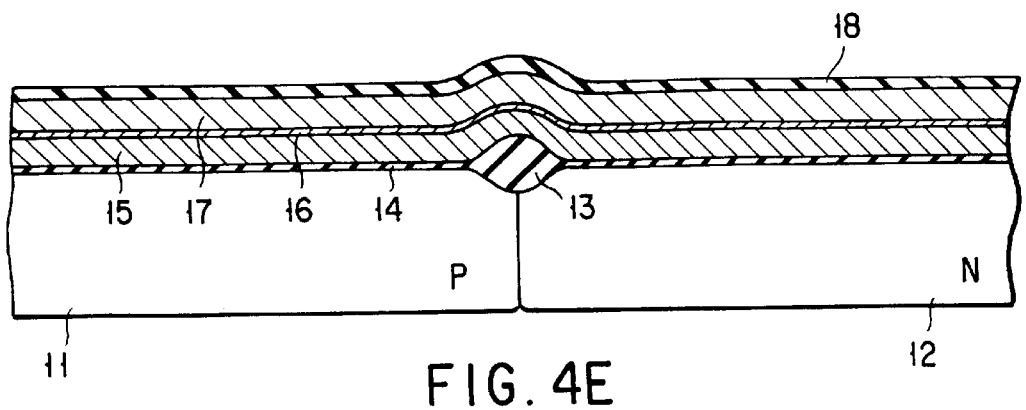
Figure 4F:
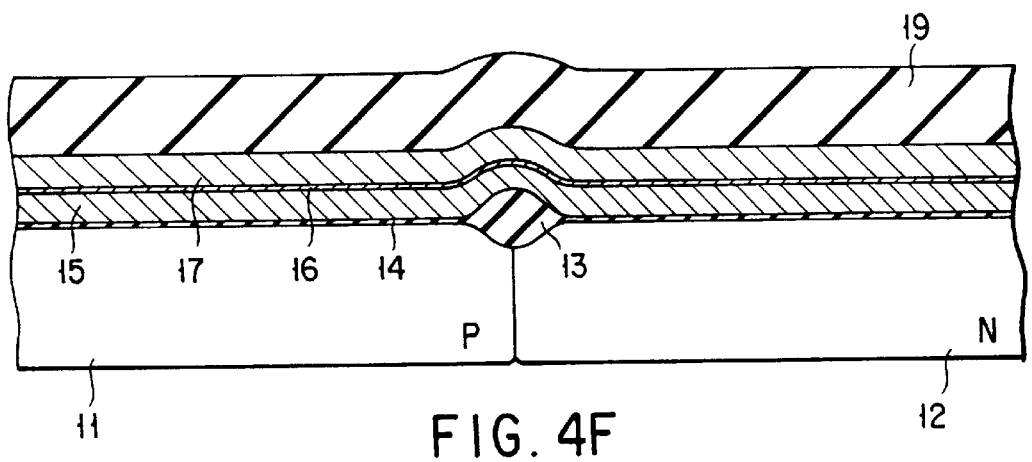

Next, as can be seen in FIG. 4E, a $WSi_xN_y$ film 16 having a thickness of about 1 nm is formed by carrying out a reactive sputtering in an atmosphere containing Ar and $N_2$ by using a $Wsi_x$ target. The $WSi_xN_y$ film 16 serves as a reaction preventing layer for suppressing the reaction between a W film, which will be later formed, and the polycrystalline silicon film 15, as well as a barrier layer for preventing the diffusion of impurities in the polycrystalline silicon film 15 within the W film.

It should be noted that the formation of the $WSi_xN_y$ film 16 may be carried out by use of a CVD method or the like, other than the method described above, or it is also possible that the film 16 may be formed by a heat process carried out at about 800° C., after forming a WN film having a thickness of several nanometers by a reactive sputtering in an atmosphere containing Ar and $N_2$ using a W target.

Next, a tungsten (W) film 17 having a thickness of about 100 nm is formed by a sputtering in an Ar atmosphere using a W target, or the CVD method or the like. When the W film 17 is left in the atmosphere after it is formed, a native oxide film 18 is formed in the surface portion of the W film 17.

Next, a reduction is carried out for about 30 minutes in a reducing atmosphere, so as to reduce the native oxide film 18 formed in the surface portion of the W film 17. Usable examples of the reducing gas are $H_2$, CO and $NH_3$. Further, other than the reducing treatment, an etching operation which uses a chemical such as diluted sulfuric acid, CDE (chemical dry etching) or CMP (chemical mechanical polishing) or the like may be used to remove the native oxide film 18.

If the resultant is left for 24 hours or more after the native oxide film 18 is removed, a native oxide film having a necessary amount for growing whiskers again, on the W film 17 is formed. In order to avoid this, within several hours after the removal of the native oxide film, a silicon nitride film 19 having a thickness of about 250 nm is deposited on the entire surface by the CVD method or the like. Even though the processing temperature for this operation is about 800° C., whiskers will never grow since the native oxide film on the W film 17 has been removed.

Figure 4G:
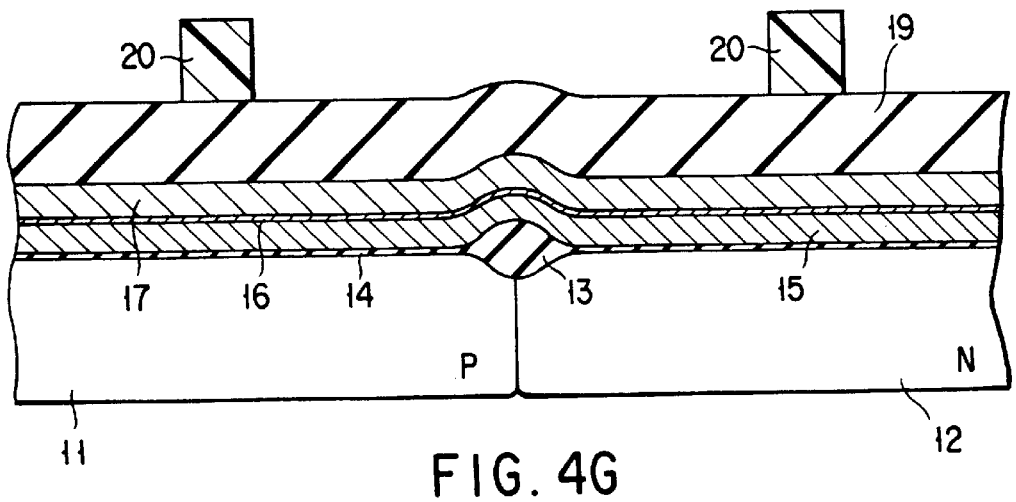
Figure 4H:
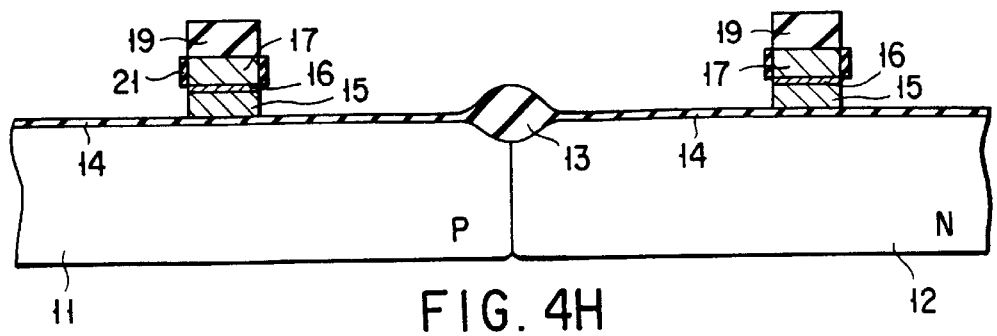

Next, as shown in FIG. 4G, a resist pattern 20 for forming a desired gate electrode (wiring) is formed by using the photolithography technique. With use of the resist pattern 20 as a mask, the silicon nitride film 19 is patterned by the RIE method. Next, the resist pattern 20 is removed by using an asher. With use of the silicon nitride film 19 as a mask, the $WSi_xN_y$ film 16 and the polycrystalline silicon film 15 are etched by the RIE method, and thus a gate electrode (wiring) as shown in FIG. 4H is formed. After patterning, a native oxide film 21 is formed on the surface of the W film 17.

Figure 4I:
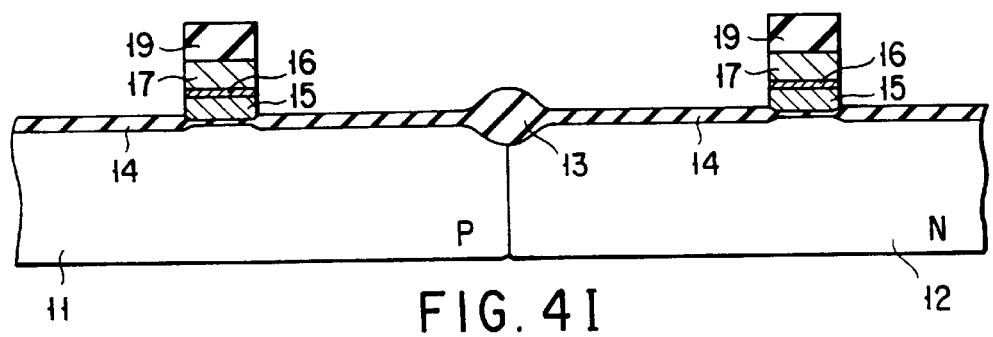

Next, as shown in FIG. 4I, a reduction is carried out at 600° C. for about 30 minutes in a reducing atmosphere, so as to reduce the native oxide film 21 formed in the surface portion of the W film 17. Usable examples of the reducing gas are $H_2$, CO and $NH_3$. Further, other than the reducing treatment, an etching operation which uses a chemical such as diluted sulfuric acid or CDE or the like may be used to remove the native oxide film 21. By removing the native oxide film 21, needle-shaped products are not generated on the side surface of the W film 17 during a high-temperature heat process, which is carried out later, and therefore the gate electrode maintains its original shape of the beginning of the process. Consequently, a low-resistance gate electrode having a high reliability can be obtained.

Immediately after the removal of the native oxide film 21 by the reduction, an oxidization process is carried out for about 60 minutes at 800° C. in an atmosphere containing $N_2$, $H_2$ and $H_2O$. This oxidization step is designed so that the W film 17 is not oxidized, but only the surfaces of the P-type region 11 and N-type region 12, and the polycrystalline silicon film 15 are oxidized. This step is called selective oxidation process hereinafter.

In the selective oxidizing process, the bottom end portion of the gate electrode (wiring) is oxidized, and a thick oxide film having a shape of bird's beak, is formed. Consequently, the corner of the bottom end portion of the gate electrode (wiring) is rounded, and therefore the concentration of an electrical field which occurs at the bottom end portion of the gate electrode (wiring) is loosened. Thus, the improvement of the reliability and characteristics of the product element can be achieved.

During the selective oxidizing process, the $H_2O$ concentration, $H_2$ concentration and heat-processing temperature are adjusted properly, and thus the generation of W oxo-acid, $WH_xO_y$, having a high vapor pressure, which is formed on the surface of the W film 17 is suppressed. For example, in the case where $H_2$ partial pressure is set at $2.5 \times 10^{-2}$ Torr and $H_2O$ partial pressure is set at $2.5 \times 10^{-3}$ Torr, the evaporation amount of the W film 17 (the amount of decrease in the thickness of the film) is suppressed to 1 nm or less.

With the employment of the conditions which suppresses the generation of oxo-acid, the reducing rate of the cross section of the gate electrode having a width of 0.1 $\mu$m, for example, is 2% or less. The value of the reducing rate for the cross section of the gate electrode, which is directly connected to the gasification amount of the W film 17 in the selective oxidization process, is negligible as compared to the influences of the other factors which reduce the cross section of the electrode, including the etching in the lateral direction by RIE when processing the electrode.

The processing conditions vary depending upon the shape of the reaction tube and the gas stream condition, and in some cases, it is necessary to pay attention to the adsorption or removal of H2O to or from the reaction tube, depending upon the material of the reaction furnace.

Figure 4J:
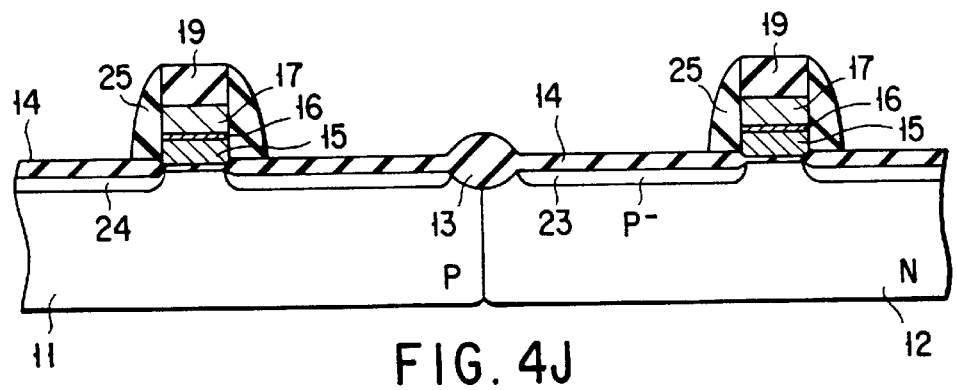

Next, as can be seen in FIG. 4J, a resist pattern (not shown) for covering the P-type region 11 is formed with use of the photolithography technique. With use of the resist pattern as a mask, $BF_2$ is ion-implanted under the conditions: 20 keV and about $7 \times 10^{15}$ cm$^{-2}$, thus forming a P$^-$-type region 23. In a similar manner, a resist pattern (not shown) for covering the N-type region 12 is formed. With use of this resist pattern as a mask, As is ion-implanted under the conditions: 20 keV and about $7 \times 10^{15}$ cm$^{-2}$, thus forming a N$^-$-type region 24.

Next, a silicon nitride film having a thickness of about 50 nm is deposited by the CVD method, and then the silicon nitride film is etched by the RIE method, thus forming a side-wall insulation film 25.

Figure 4K:
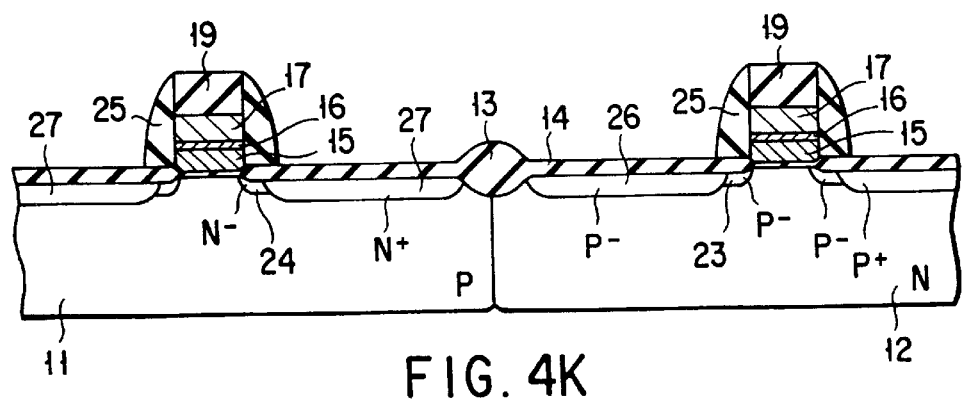

Next, as can be seen in FIG. 4K, a resist pattern (not shown) for covering the P-type region 11 is formed with use of the photolithography technique. With use of the resist pattern as a mask, $BF_2$ is ion-implanted under the conditions: 60 keV and about $7 \times 10^{15}$ cm$^{-2}$, thus forming a P$^+$-type region 26. In a similar manner, a resist pattern (not shown) for covering the N-type region 12 is formed. With use of this resist pattern as a mask, As is ion-implanted under the conditions: 60 keV and about $6 \times 10^{15}$ cm$^{-2}$, thus forming a N$^+$-type region 27. Lastly, an annealing is carried out so as to activate the P$^-$-type region 23, the N$^-$-type region 24, the P$^+$-type region and the N$^+$-type region 27.

Next, an interlayer insulation film and a wiring are formed by an ordinary method, thus completing a CMOSFET.

According to this example, the vapor pressure of W oxo-acid is suppressed and therefore the narrowing and thinning of a W wiring which constitutes a gate electrode (wiring), and the growth of whiskers can be suppressed. Consequently, it is possible to form a gate electrode (wiring) of a desired shape and a designed resistance value.

Figure 5:
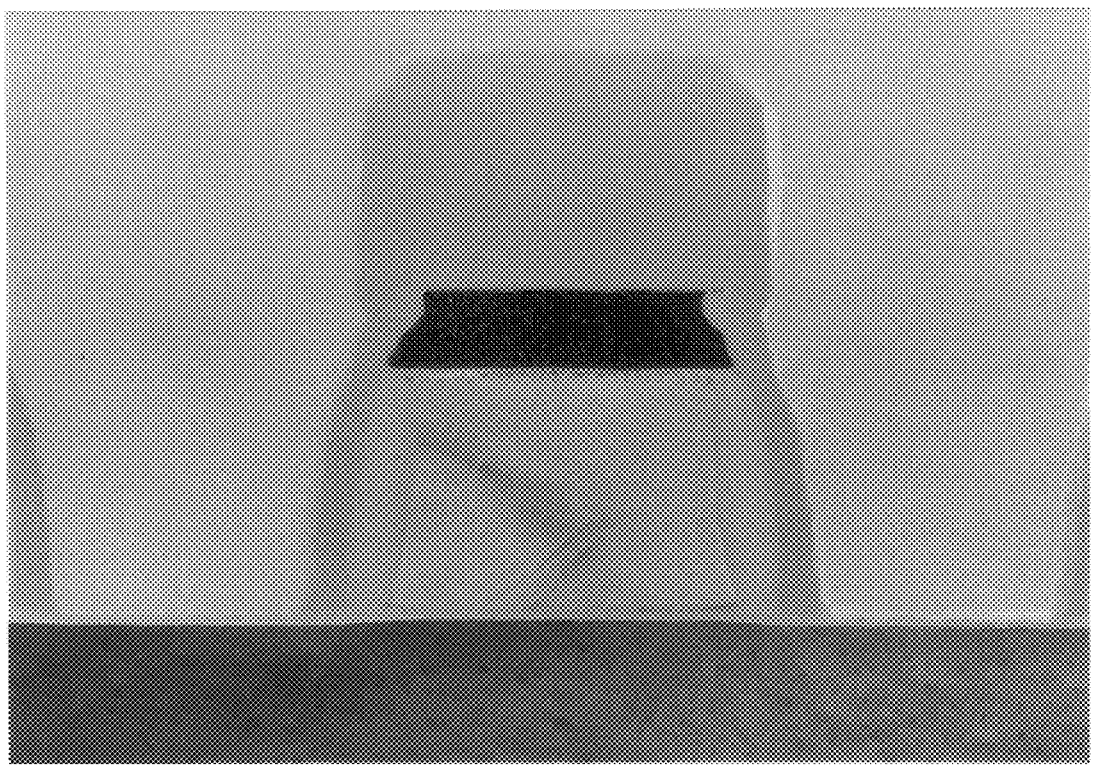
FIG. 5 is a photograph showing a gate structure corresponding to FIG. 4J, taken under a TEM, which is obtained when selective oxidization is carried out under a condition of the second example.

FIG. 5 is a photograph taken under a microscope, showing a gate structure corresponding to that of FIG. 4J in the case where selective oxidization is carried out under the conditions specified in this example. In the photograph of FIG. 5, a dark section in black is the W film and a section underneath the black section is a polycrystalline silicon film. A $SiO_2$ film is formed on a side of the polycrystalline silicon film. The vicinity of the mid-portion of the $SiO_2$ film is originally a side surface of the polycrystalline silicon film, and further the position of this side surface is also the position of the side surface of the W film.

From the photograph shown in FIG. 5, it can be understood that the side surface of the polycrystalline silicon is oxidized by selective oxidization to become the $SiO_2$ film which grows in an inner and outer sides of the polycrystalline silicon film.

Further, as can be seen in the photograph of FIG. 5, the mid-portion of the $SiO_2$ film coincides with the position of the side surface of the W film. From this fact, it can be understood that the side surface of the polycrystalline silicon film is oxidized by selective oxidization, whereas the W film is hardly oxidized. It should be noted that the narrowed upper section of the side surface of the W film is resulted not by the oxidization but by the patterning of the W film by the RIE.

Figure 6:
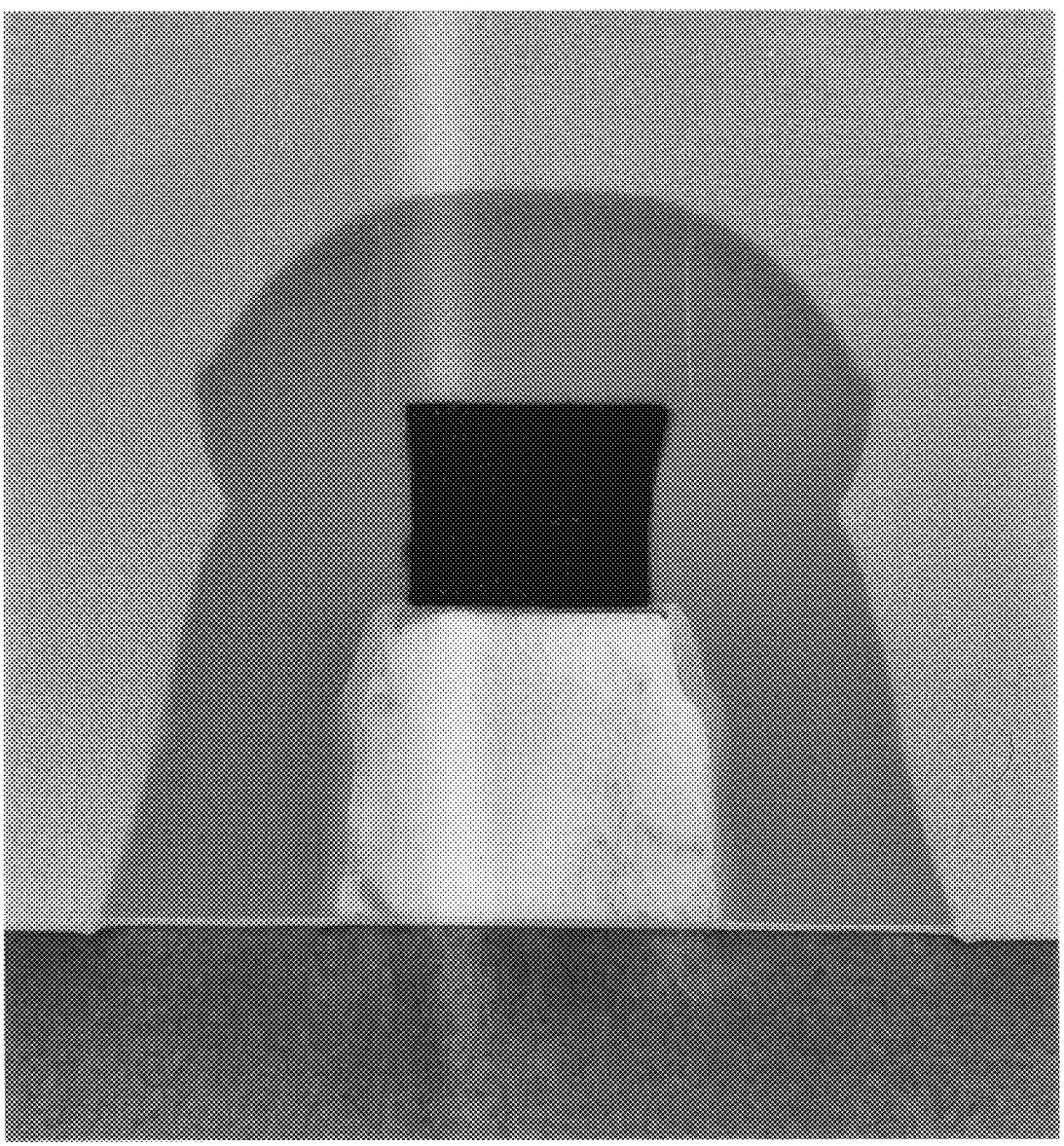
FIG. 6 is a photograph showing a gate structure corresponding to FIG. 4J, taken under a TEM, which is obtained when selective oxidization is carried out under a condition where the partial pressure of $H_2O$ is increased to a high level.

In contrast, FIG. 6 is a photograph taken under a microscope, showing a gate structure corresponding to that of FIG. 4J in the case where selective oxidization is carried out under the conditions specified in this example except that the $H_2O$ partial pressure is set to $3.0 \times 10^{-2}$ atom, and the $H_2$ partial pressure is set to $2.4 \times 10^{-2}$ atom, thus the $H_2O$ partial pressure being higher than the $H_2$ partial pressure. As can be seen in the photograph of FIG. 6, the vicinity of the mid-portion of the $SiO_2$ film does not coincides with the position of the side surface of the W film, but the position of the side surface of the W film is located inward of the vicinity of the mid-portion of the $SiO_2$ film. Therefore, not only the side surface of the polycrystalline silicon film, but also the side surface of the W film are oxidized, and oxo-acid is created. Thus, the width of the film is reduced (narrowing). That is, under these conditions, the vapor pressure of W oxo-acid is $3.3 \times 10^{-6}$ atom, which is significantly higher than the vapor pressure ($1.5 \times 10^{-10}$ atom) of W oxo-acid under the conditions of this example.

EXAMPLE 3

FIGS. 7A to 7L are cross sectional views showing the steps of the manufacture of a semiconductor device according to the third example of the present invention.

Figure 7A:
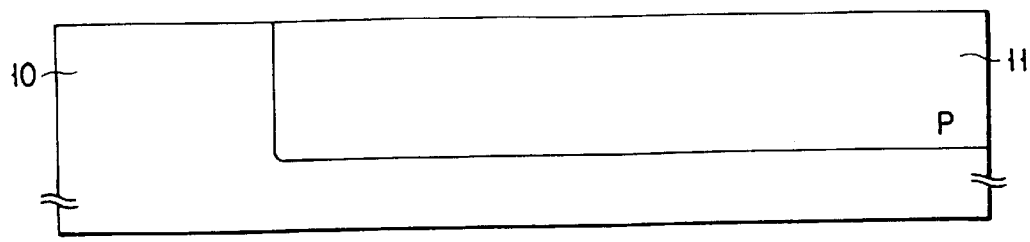
FIGS. 7A to 7L are cross sectional views illustrating steps of the method of manufacturing a semiconductor device, according to the third embodiment.
Figure 7B:
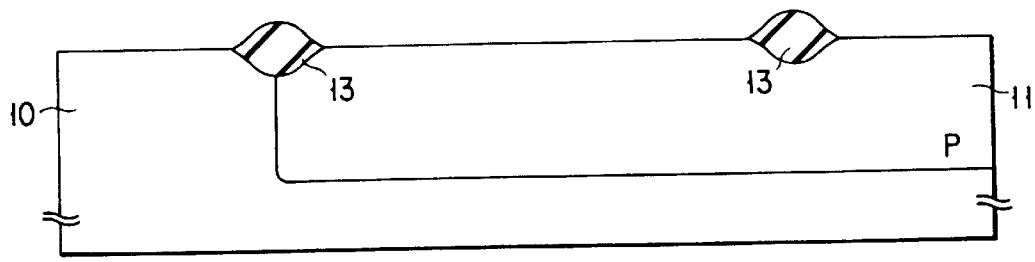

First, as shown in FIG. 7A, a resist pattern (not shown) which covers a predetermined region of a silicon substrate 10 is formed by a photolithography technique. With use of the resist pattern as a mask, B, Ga or In is ion-implanted to the silicon substrate 10. Then, after the resist pattern is removed, a heat diffusion is carried out, and thus a P-type region 11 having a depth of about 1 μm is formed. Next, as can be seen in FIG. 7B, an element isolation region 13 made of a silicon oxide film having a thickness of about 600 nm is formed at a predetermined region with use of, for example, LOCOS method.

Figure 7C:
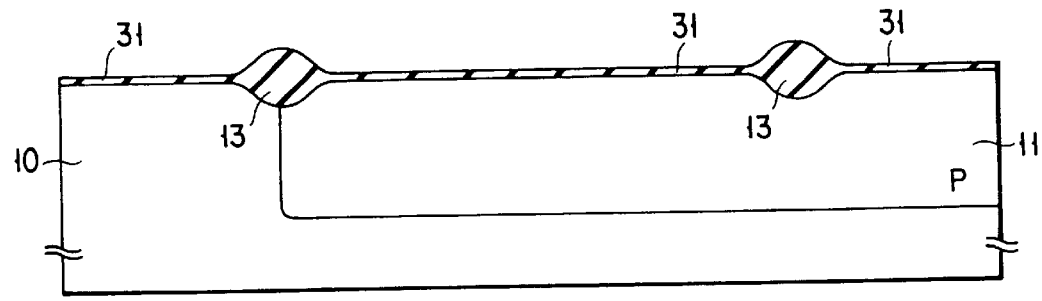

Subsequently, as can be seen in FIG. 7C, a protection oxide film 31 made of a silicon oxide film having a thickness of about 10 nm is formed, and then, another ion-implantation is carried out to match the threshold value of the transistor.

Figure 7D:
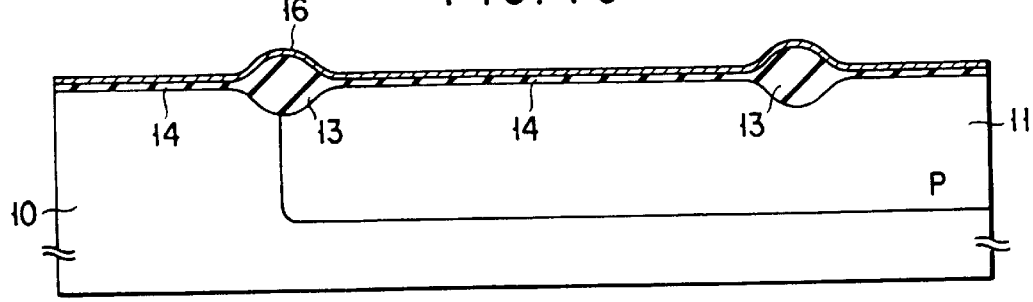

After that, as can be seen in FIG. 7D, the protection oxide film 31 is removed and a gate oxide film 14 having a thickness of about several nanometers to 10 nm is formed on the exposed surfaces of the silicon substrate 10 and the P-type region 11. Further, a $WSi_xN_y$ film 16 having a thickness of about 5 nm is deposited on the entire surface by carrying out a reactive sputtering in an atmosphere containing Ar and $N_2$ by using a W target.

Figure 7E:
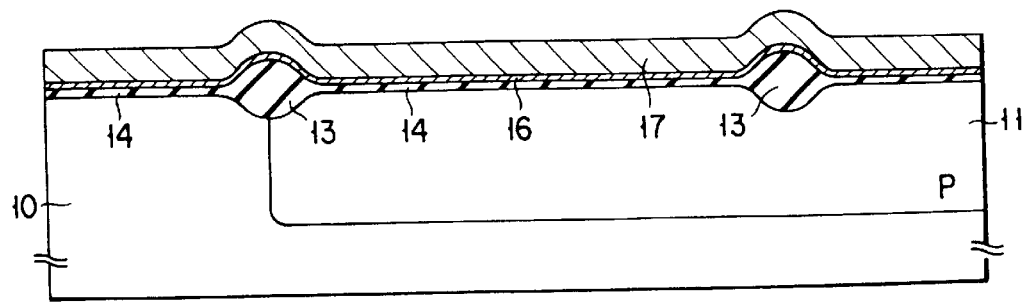

Next, as can be seen in FIG. 7E, a tungsten (W) film 17 having a thickness of about 100 nm is formed by a sputtering in an Ar atmosphere using a W target, or the CVD method or the like.

Next, a wet etching is carried out using diluted sulfuric acid, so as to remove the native oxide film formed in the surface portion of the W film 17. Further, for the removal of the native oxide film, it is possible to use a chemical other than diluted sulfuric acid, or to employ CDE, CMP or the like. Further, the native oxide film may be removed by means of the reducing effect which occurs when heated at about 600° C. in an atmosphere of $H_2$, CO or $NH_3$, or the like.

Figure 7F:
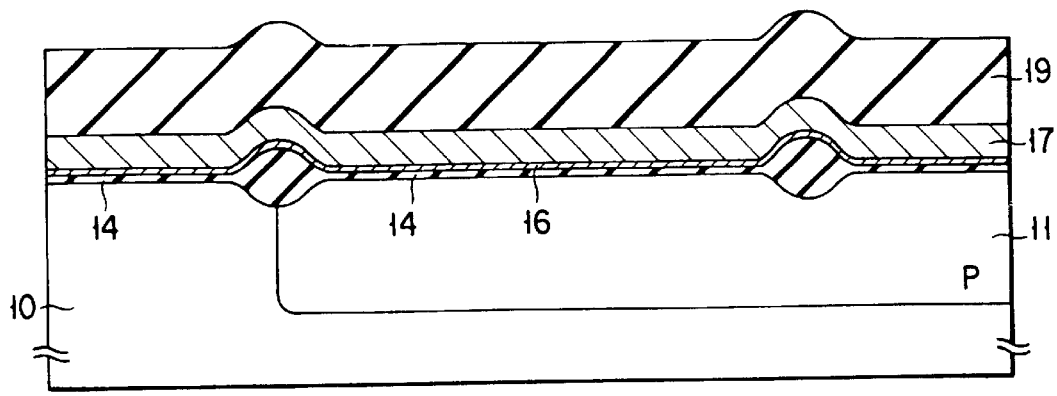

Subsequently, as can be seen in FIG. 7F, a silicon nitride film 19 having a thickness of about 250 nm is formed by the CVD method or the like. In the case of the prior art technique, where such a silicon nitride film 19 is formed by the CVD method or the like, under the conditions, a substrate temperature of about 800° C., and a film forming time of about 30 minutes, whiskers would be generated on the W film 17, which is due to the native oxide film on the W film 17. In this embodiment, the native oxide film on the W film 17 is already removed, the generation of such needle-shaped products can be effectively prevented.

Figure 7G:
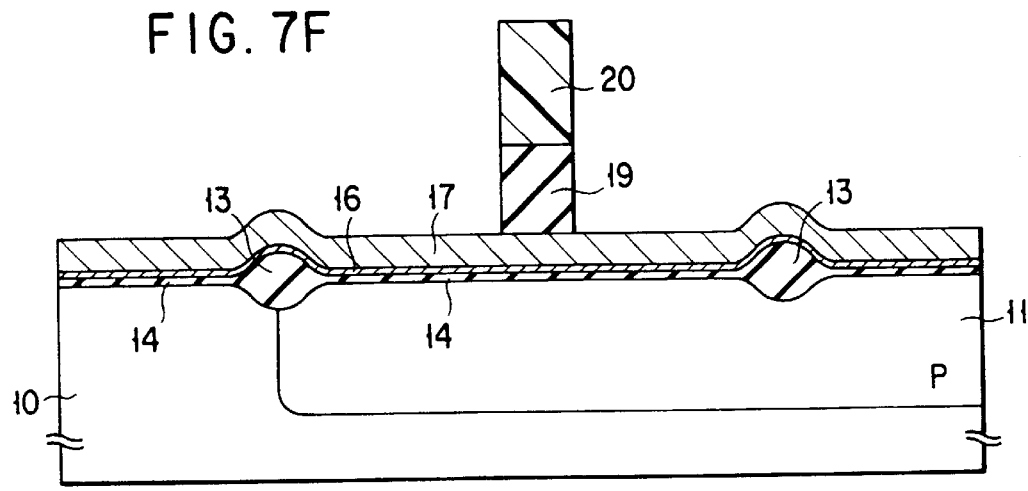
Figure 7H:
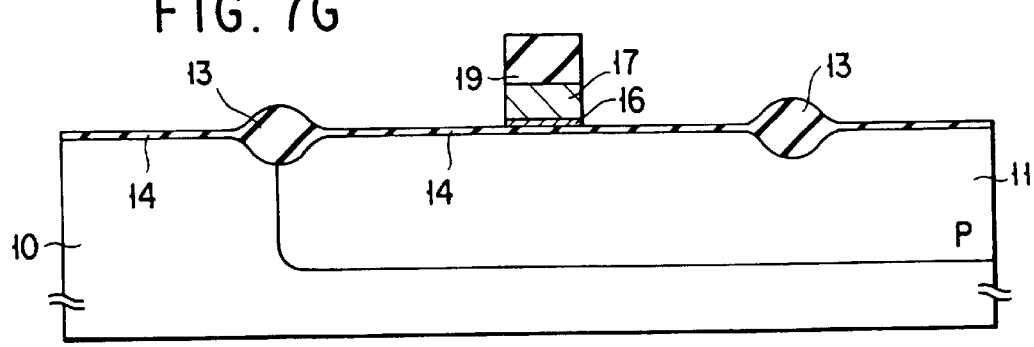

Next, as can be seen in FIG. 7G, a resist pattern 20 for forming a desired gate electrode (wiring) is formed by using the photolithography technique. With use of the resist pattern 20 as a mask, the silicon nitride film 19 is etched by the RIE method. Next, the resist pattern 20 is removed by using an asher. With use of the silicon nitride film 19 as a mask, the W film 17 and the $WSi_xN_y$ film 16 are etched by the RIE method, and thus a gate electrode or wiring such as shown in FIG. 7H is formed.

Figure 7I:
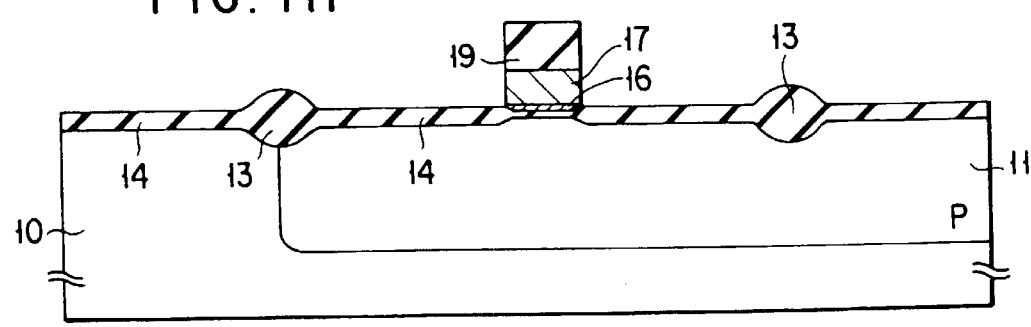

Next, a native oxide film existing at this point on the side surface of the W film 17 is removed again by any of the above methods, and then as shown in FIG. 7I, a selective oxidization is carried out at 800° C. for about 30 minutes in an atmosphere of $H_2O$, $H_2$ or $N_2$. With this oxidization step, only the surfaces of the Si substrate 10 and the P-type region 11 can be oxidized without oxidizing the W film 17. Therefore, the damage to the end of the gate electrode can be lessened, and the concentration of an electrical field is suppressed.

In terms of thermodynamics, a W oxide more easily generates oxo-acid than W, and therefore unless the removal of an oxide film, the vapor pressure of oxo-acid rapidly increases, and re-crystallization occurs, to generate whiskers. In this example, the native oxide film on the W film 17 is removed, and therefore the growth of whiskers is suppressed.

When a gas is allowed to flow continuously into the chamber during a selective oxidization process, a gas having a low oxo-acid concentration flows onto the wafer at all times, thus promoting the reaction of generating oxo-acid. In order to avoid this, after the mixture gas of $H_2O$, $H_2$ and $N_2$, is introduced into the chamber, the gas is sealed in the chamber at an initial stage of the selective oxidization step. With the sealing of the gas, macroscopically, the flow due to the heat convection caused by a difference in temperature becomes the dominant portion of the entire gas flow occurring within the chamber during the selective oxidization process. As a result, the effect of suppressing the generation of W oxo-acid can be obtained.

Here, when the $H_2O$ partial pressure, $H_2$ partial pressure and heat-processing temperature are adjusted properly, the vapor pressure of W oxo-acid, $WH_xO_y$, generated can be suppressed at a low level. For example, in the case where $H_2$ partial pressure is set at $2.5 \times 10^{-2}$ Torr and $H_2O$ partial pressure is set at $2.5 \times 10^{-3}$ Torr, the vapor pressure of W oxo-acid, $WH_xO_y$ becomes about $1.5 \times 10^{-10}$ Torr. Consequently, the gasification amount of the W film is suppressed to 1 nm or less. With the employment of these conditions, the reducing rate of the cross section of the gate electrode having a width of 0.1 μm, for example, becomes 2% or less.

The value of the reducing rate for the cross section of the gate electrode, which is directly connected to the gasification amount of the W film 17 in the selective oxidization process, is negligible as compared to the influences of the other factors which reduce the cross section of the electrode, including the etching in the lateral direction by RIE when processing the electrode. As the vapor pressure of oxo-acid is decreased, the narrowing of the gate electrode, caused by the gasification of the W film, is suppressed, and therefore it becomes possible to obtain a gate electrode having a designed shape.

Figure 7J:
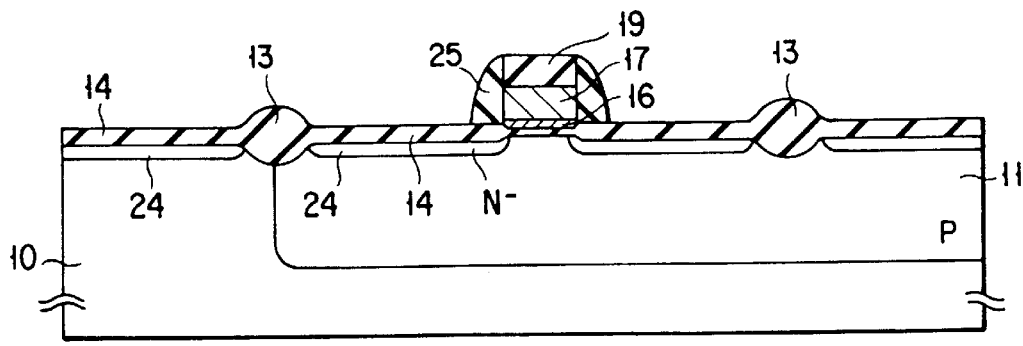

Next, as can be seen in FIG. 7J, As is ion-implanted under the conditions: 20 keV and about $5 \times 10^{14}$ cm$^{-2}$, thus forming a N$^-$-type region 24. Then, a silicon nitride film having a thickness of about 50 nm is deposited by the CVD method, and then the silicon nitride film is etched by the RIE method, thus forming a side-wall insulation film 25.

Figure 7K:
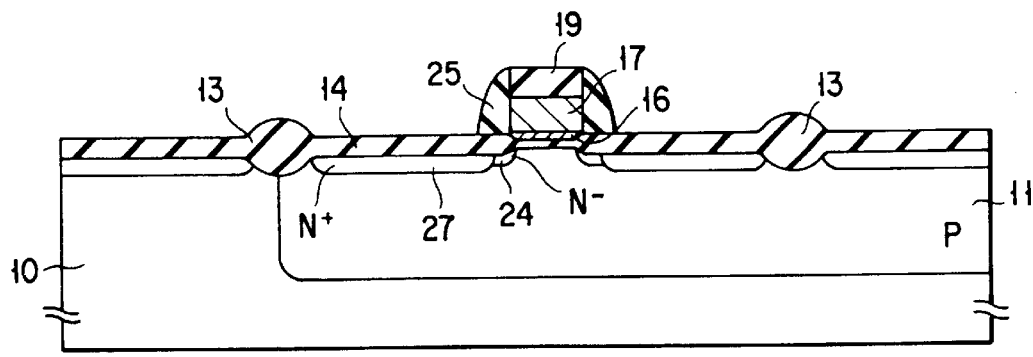

Next, as can be seen in FIG. 7K, As is ion-implanted under the conditions: 60 keV and about $7 \times 10^{15}$ cm$^{-2}$, thus forming a N$^+$-type region 27.

Figure 7L:
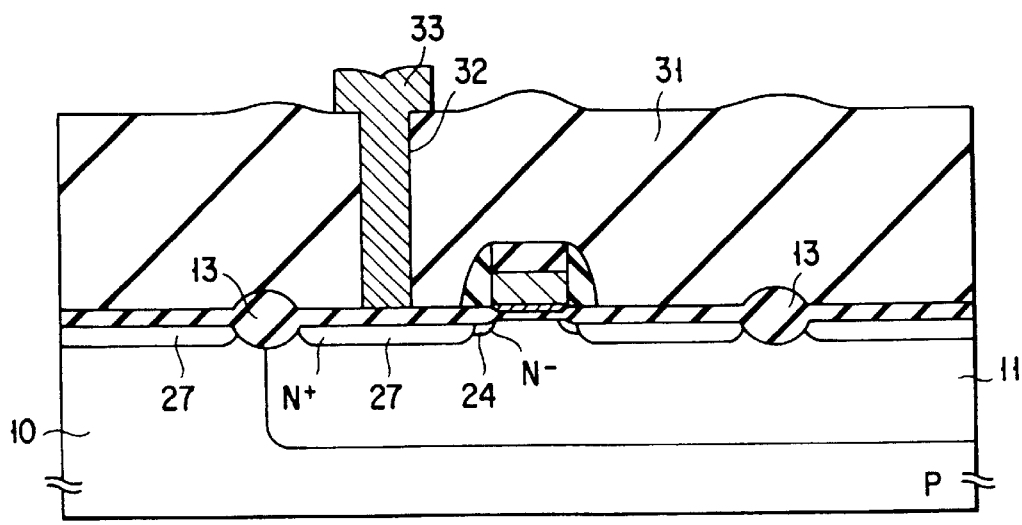

Further, as can be seen in FIG. 7L, an interlayer insulation film 31 made of a silicon nitride film is deposited, and then a wiring 33 made of Al is formed in the contact hole 32 connected to the N$^+$-type region 27.

According to this embodiment, also as to the metal gate of a single layer, the vapor pressure of W oxo-acid is controlled during a selective oxidization process, so as to obtain a gate electrode of a desired shape and a resistance value.

It should be noted that the present invention is not limited to the above-described examples. For example, these examples are directed to the cases of gate electrodes (wirings) containing W; however in place of W, some other refractory metal such as Mo may be used to obtain a similar effect. Also, the present invention can be applied to other metal electrode (wiring) than a gate electrode (wiring).

Apart from the above, the present invention can be remodeled into various versions as long as the essence of the invention remains.

As described above, according to the present invention, it is possible to control the vapor pressure of metal oxo-acid. Consequently, the increase in the wiring resistance and the degrading of the shape, which are caused by the narrowing and thinning of the metal wiring, can be prevented, and thus a semiconductor device with a high performance can be manufactured.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:

a semiconductor substrate;

a gate insulation film formed on the semiconductor substrate; and a gate electrode made of a laminate member including a silicon layer formed on the gate insulation film and a refractory metal layer;

wherein a side end portion of the refractory metal layer projects beyond a side surface of the silicon layer, and a silicon oxide film is formed on the side surface of the silicon layer and underneath the side end portion of the refractory metal layer.

2. A semiconductor according to claim 1, wherein a length of a portion projecting sideward of the refractory metal layer is in a range between 1 and 10 nm.

3. A semiconductor according to claim 1, wherein the refractory metal is one selected from the group consisting of tungsten, molybdenum and titanium.

4. A semiconductor device according to claim 1, wherein the silicon layer is a polycrystalline silicon layer.

* * * * *